United States Patent
Ohfuchi et al.

(10) Patent No.: US 8,141,962 B2
(45) Date of Patent: Mar. 27, 2012

(54) ROBOT CONTROLLING APPARATUS AND ROBOT SYSTEM

(75) Inventors: Yoshitaka Ohfuchi, Kitakyushu (JP); Toshitaka Miyazato, Kitakyushu (JP); Yoshihiro Kusama, Kitakyushu (JP)

(73) Assignee: Kabushiki Kaisha Yaskawa Denki, Fukuoka (JP)

( * ) Notice: Subject to any disclaimer, the term of this patent is extended or adjusted under 35 U.S.C. 154(b) by 784 days.

(21) Appl. No.: 12/296,229

(22) PCT Filed: Mar. 13, 2007

(86) PCT No.: PCT/JP2007/054872
§ 371 (c)(1),
(2), (4) Date: Oct. 6, 2008

(87) PCT Pub. No.: WO2007/122903
PCT Pub. Date: Nov. 1, 2007

(65) Prior Publication Data
US 2010/0156253 A1    Jun. 24, 2010

(30) Foreign Application Priority Data
Apr. 7, 2006   (JP) ................................. 2006-106198

(51) Int. Cl.
A47B 53/00 (2006.01)
A47B 97/00 (2006.01)
A47B 81/00 (2006.01)
A47B 49/00 (2006.01)

(52) U.S. Cl. ......... 312/201; 312/291; 312/290; 312/326

(58) Field of Classification Search .................. 312/201, 312/291, 326, 327, 328, 329, 223.1, 283, 312/351.1
See application file for complete search history.

(56) References Cited

U.S. PATENT DOCUMENTS
1,241,615 A * 10/1917 Farrow ............................. 109/23
(Continued)

FOREIGN PATENT DOCUMENTS
| JP | 58-181591 A | 10/1983 |
| JP | 3-502748 A | 6/1991 |
| JP | 4-365581 A | 12/1992 |
| JP | 5-336623 A | 12/1993 |

OTHER PUBLICATIONS

Chinese Office Action issued May 12, 2010 in corresponding Chinese application No. 2007180009632.2.

*Primary Examiner* — David Dunn
*Assistant Examiner* — Ryan A Doyle
(74) *Attorney, Agent, or Firm* — Ditthavong Mori & Steiner, P.C.

(57) ABSTRACT

A robot controlling apparatus ensures that the maintenance work can be property and safety practiced and efficiently uses the space of the housing of the robot controlling apparatus.

A robot controlling apparatus is provided with a first housing (1) for accommodating first internal devices (6), a second housing (2) for accommodating second internal devices (7), and a front door (3) supported by a first hinge (4), which is provided on a side of the first housing, being capable of freely opening and closing, wherein a second hinge (5) is provided on the sides of the first and the second housing and the entire first housing is supported by the second hinge being capable of freely opening and closing with respect to the second housing and the accommodating portion (11) extending from a front portion of the second housing under the second front opening.

6 Claims, 4 Drawing Sheets

U.S. PATENT DOCUMENTS

| | | | |
|---|---|---|---|
| 4,240,222 A * | 12/1980 | Covington | 43/57.1 |
| 4,978,001 A * | 12/1990 | Nelson | 206/748 |
| 5,484,219 A * | 1/1996 | Drew et al. | 403/57 |
| 5,528,011 A * | 6/1996 | Kono et al. | 219/86.41 |
| 5,573,319 A * | 11/1996 | Dirk | 312/100 |
| 5,949,209 A * | 9/1999 | Okamoto et al. | 318/563 |
| 6,066,802 A * | 5/2000 | Reinke et al. | 174/50 |
| 6,642,481 B2 * | 11/2003 | Sievert et al. | 219/130.1 |
| 2007/0184339 A1 * | 8/2007 | Scheucher | 429/99 |

* cited by examiner

ROBOT CONTROLLING APPARATUS AND ROBOT SYSTEM

TECHNICAL FIELD

The present invention relates to a method of downsizing the structure of a controller for an industrial robot.

BACKGROUND ART

Concerning the structure of a controller of a conventional robot or the structure of a controller similar to it, an upper face portion of a housing of the controller is composed being freely opened and closed by a hinge and further an intermediate partition plate, which is opened and closed by a hinge, is provided in the housing of the controller. Concerning this controller, for example, refer to Patent Document 1. According to Patent Document 1, the following structure is disclosed. For the maintenance of an operating portion or a displaying portion provided inside an upper face portion of a housing, an upper face portion is supported by a hinge being freely opened and closed like a door opened upward. In order to downsize the controller, internal devices of the controller, which are densely arranged in the housing so as to downsize the controller, are partitioned by an intermediate partition plate and when the intermediate partition plate is opened and closed in the longitudinal direction inside the housing like a door, the devices arranged in the inner part of the intermediate partition plate may be checked and maintained.

In a robot controller into which an arc welding electric power source is incorporated, a lower portion of a bulkhead is made to be a portion in which the arc welding electric power source is accommodated and an upper portion of the bulkhead is made to be a portion in which the robot control unit is accommodated. Further, a sliding structure is employed so that the arc welding electric power source may be dragged out. Concerning this structure, for example, refer to Patent Document 2. According to Patent Document 2, the welding electric power source and the robot controller are accommodated in the same housing. Therefore, the entire unit may be downsized and the cables may be orderly laid. Further, when the welding electric power source is slid, the unit may be easily checked and maintained.

Patent Document 1: JP-A-58-181591
Patent Document 2: JP-A-4-365581

DISCLOSURE OF THE INVENTION

Problems that the Invention is to Solve

As may be seen in the official gazettes of the prior art, in order to reduce a space, in which the controller used for an industrial robot is installed, as small as possible, there is a strong demand for downsizing the controller used for an industrial robot. On the other hand, it is a task to compose the controller so that internal devices, which are complicatedly, densely arranged, may be easily checked and maintained.

In the conventional robot controller described in Patent Document 1, since the intermediate partition plate, which is opened and closed by the hinge, is provided, a motor drive unit, which is arranged in the most inner part, and other devices may be checked and maintained. However, since the intermediate partition plate and the hinge are arranged inside the housing of the controller, even when the intermediate partition plate is opened, the devices such as a motor drive unit and others, which are arranged in the inner part, must be checked and maintained in the small housing. Further, in the actual structure, in the periphery of the hinge of the intermediate partition plate, cables connected to the devices attached onto the intermediate partition plate are arranged. Therefore, even when a sufficiently large hinge rotation angle is provided, the intermediate partition plate may not be opened by a sufficiently large angle being obstructed by a bending reaction force generated by the cables. Accordingly, the working efficiency may not be enhanced and further it is difficult to maintain the safety of working. Further, the devices attached to the intermediate partition plate must be arranged so that they may not interfere with the other devices when the intermediate partition plate is opened. Therefore, it is impossible to arbitrarily arrange the devices and the space in the housing may not be effectively utilized.

According to the conventional robot controller described in Patent Document 2, it may be thought that the devices may be easily checked and maintained when the internal devices such as a welding electric power source are made into a sliding type. However, compared with the structure in which the hinge is used, the sliding type is disadvantageous in that distances of moving the cables are increased. Therefore, it is necessary to compose the devices so that the cables are not dragged. That is, in the case of the sliding type, there is a high possibility that the cables fall off and damage.

The present invention has been accomplished to solve the above problems. It is an object of the present invention to provide a robot controller used for an industrial robot capable of ensuring the efficiency and safety of working and also capable of sufficiently utilizing a space in the housing into which the devices are attached.

Means for Solving the Problems

In order to solve the above problems, the present invention is composed as follows.

According to a first aspect of the invention, a controller for an industrial robot is provided with a first housing which accommodates a first internal device, a second housing which accommodates a second internal device, and a front door which is supported to open and close by a first hinge which is provided on a side of the first housing, wherein a second hinge is provided on the sides of the first housing and the second housing, and second housing is supported to open and close the entire first housing by the second hinge.

According to a second aspect of the invention, the controller for the industrial robot is provided with an accommodating portion which protrudes from a front face lower portion of the second housing to a lower portion of the first housing and accommodates a third internal device, wherein the third internal device is exposed to an opening which is provided on an upper face of the accommodating portion when the first housing is opened from the second housing by the second hinge.

According to a third aspect of the invention, a robot body is coupled to the controller for the industrial robot.

Advantages of the Invention

According to the first aspect of the invention, it is possible to provide a small robot controller, the working efficiency and the safety of which are enhanced and the accommodating capacity of accommodating the internal devices of which is increased. The housing of the robot controller is divided into two portions in the longitudinal direction and the divided housings are supported by a hinge. Therefore, the front housing is moved and separated being rotated by the hinge. Accordingly, unlike the conventional structure in which the partition plate is opened and closed inside the housing and the peripheral housing is not moved at the time of the maintenance of the internal devices accommodated in the rear housing, in the structure of the present invention, the maintenance work is not obstructed by the housing itself. Accordingly, the working efficiency is not lowered. Further, unlike the conventional structure in which the devices mounted on the partition plate interfere with the other devices arranged in the housing at the time of opening the partition plate, in the case of the structure of the invention, it is unnecessary to give consideration to such a problem. Therefore, at the time of laying out the internal devices in the housing, it is possible to effectively use the inner space of the housing. Further, since the housing is supported by the hinge, compared with the conventional sliding type structure, the cables are not greatly moved. Accordingly, the possibility of falling and damaging of the cables is low and the safety property is enhanced.

According to the second aspect of the invention, when the housing on the worker's side is opened, an upper surface opening of the accommodating portion located in a lower portion of the housing on the worker's side may be seen. Therefore, it becomes possible for the worker to gain access from this opening to the internal devices accommodated in the accommodating portion. Accordingly, when a terminal table, optional devices and cables are accommodated as the internal devices, it is easy to connect the terminal table and it is also possible to accommodate the cables. Further, it is easy to install more optional devices.

According to the third aspect of the invention, whereby the above small robot controller with high maintenance property is used, an installation space of the robot system may be reduced when a robot system is built.

DESCRIPTION OF THE REFERENCE NUMERALS AND SIGNS

Figure 1:
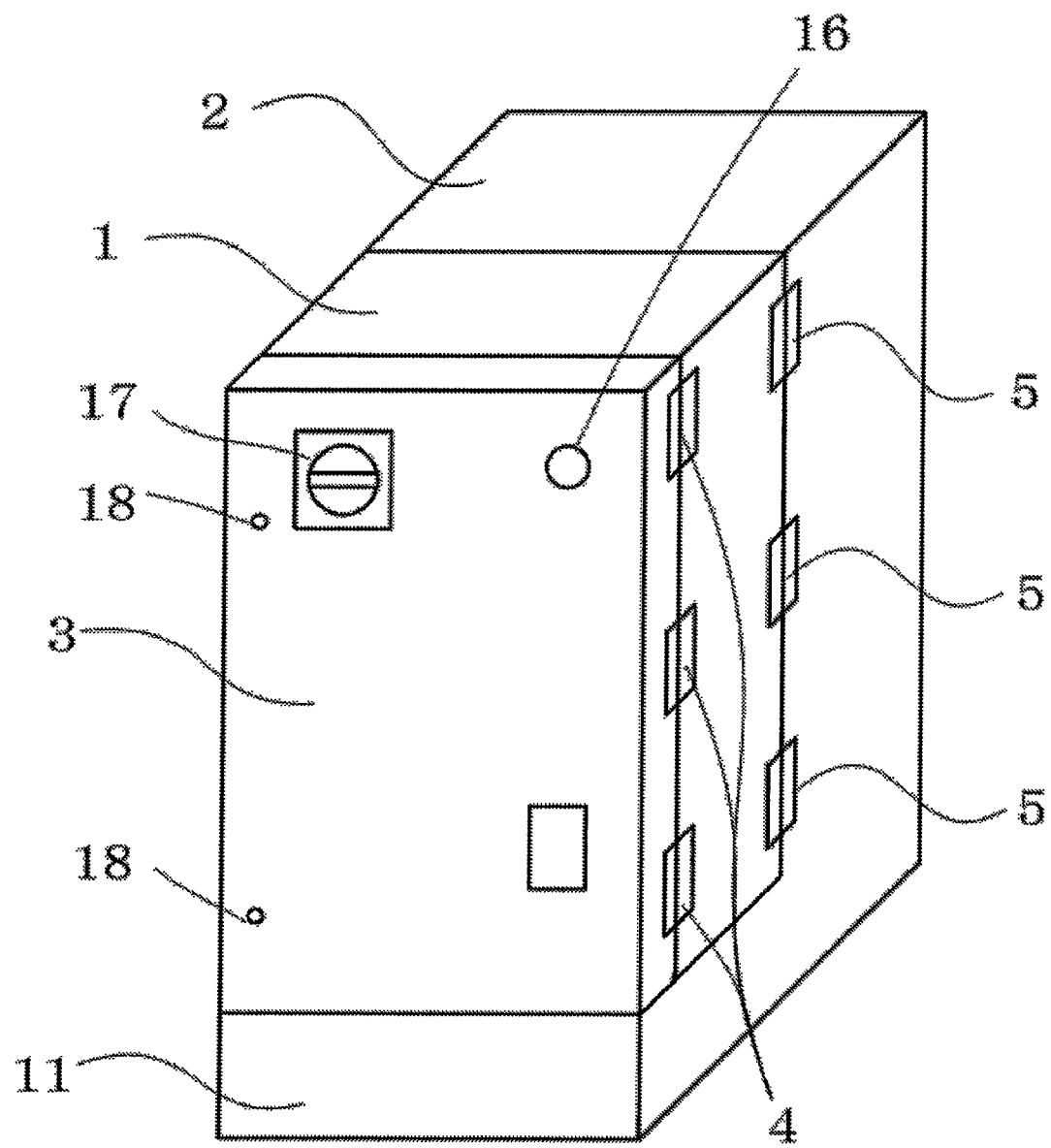
FIG. 1 is a front view of a controller for an industrial robot showing the first embodiment of the present invention.

1 First housing
2 Second housing
3 Front door
4 First hinge
5 Second hinge
6 First internal devices
7 Second internal devices
8 Third internal devices
9 Cable
11 Accommodating portion
12 Opening
13 Cable
14 Back plate
15 Cable
16 Emergency stop switch
17 Main electric power switch
18 Screw
19 Industrial robot body
20 Robot controller

BEST MODE FOR CARRYING OUT THE INVENTION

Embodiments of the invention are explained below with reference to FIGS. 1 to 3.

Embodiment 1

FIG. 1 is a front view of a robot controller of the present invention.

Figure 2:
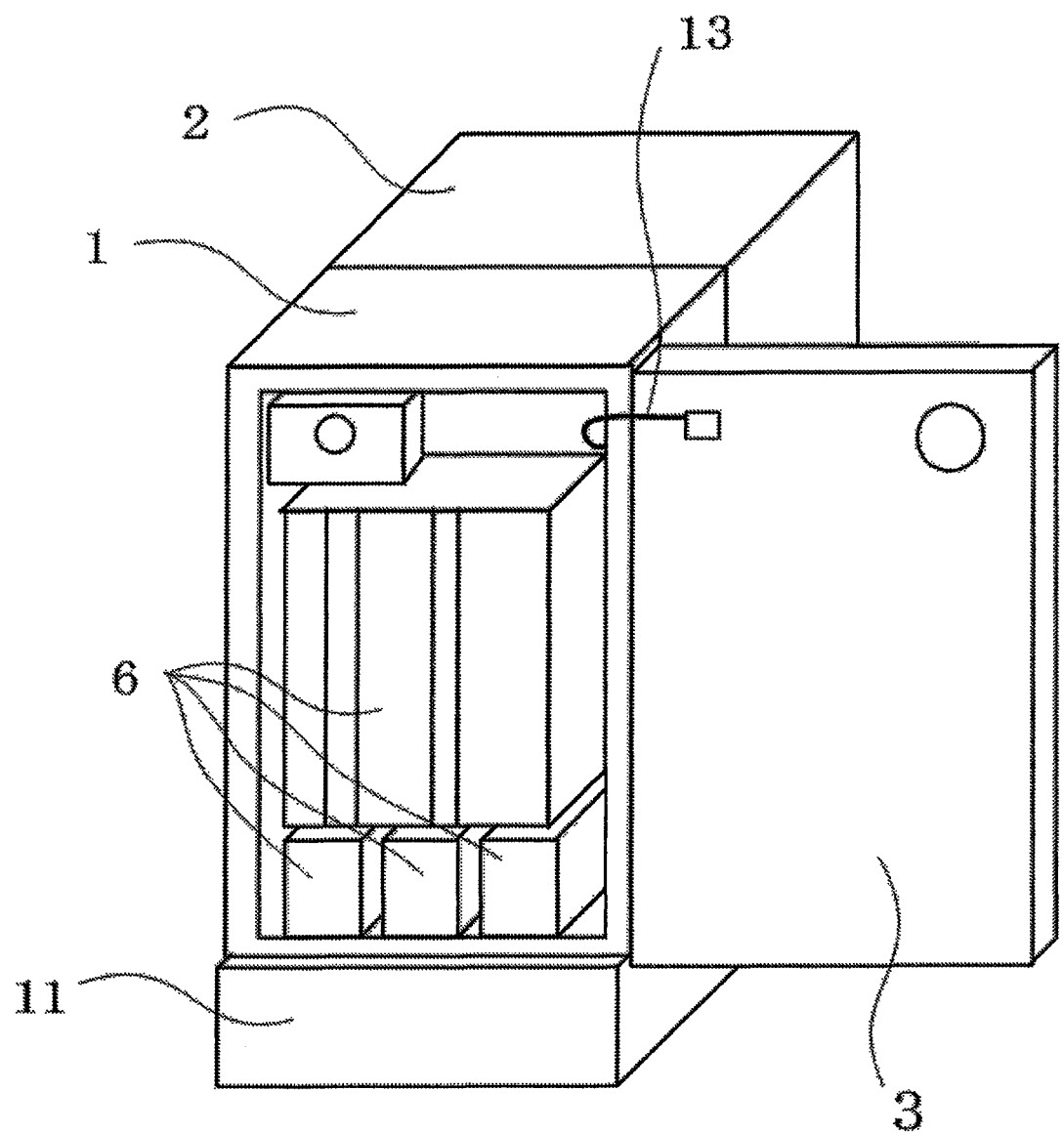
FIG. 2 is a view showing a state in which a front door is opened in FIG. 1.

FIG. 2 shows a state in which a front door described later is opened in FIG. 1.

Figure 3:
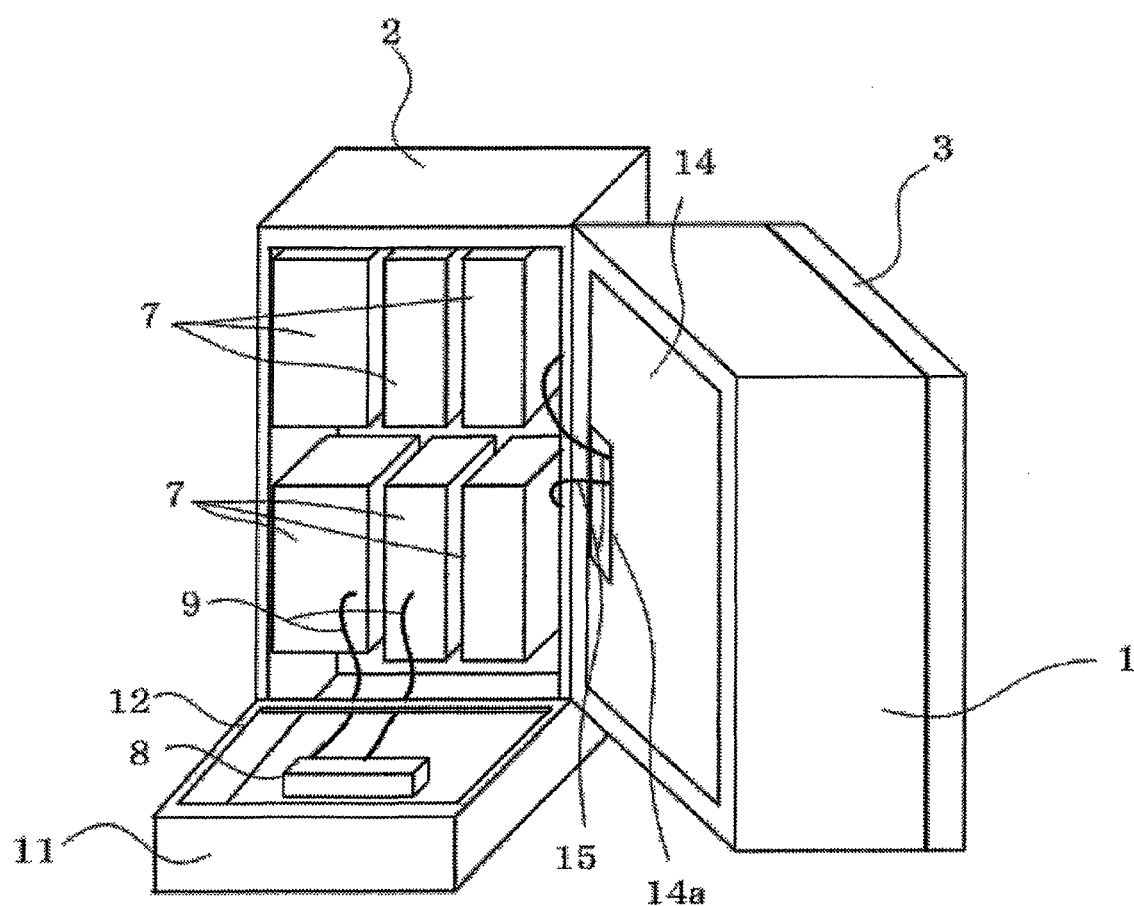
FIG. 3 is a view showing a state in which the first housing is opened in FIG. 1.

FIG. 3 is a view showing a state in which the first housing described later is opened in FIG. 1.

Figure 4:
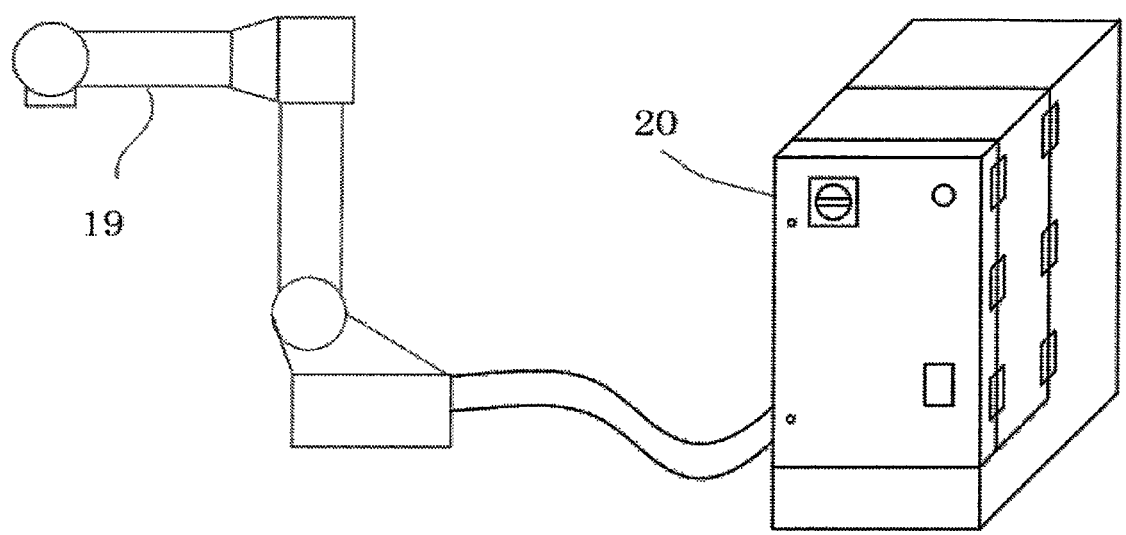
FIG. 4 is a conceptual view showing a robot system in which a robot controller of the present invention and an industrial robot are connected to each other.

FIG. 4 is a conceptual view showing a robot system in which a robot controller of the present invention and an industrial robot are connected to each other.

As shown in FIG. 4, the robot controller of the present invention is usually connected to an industrial robot body by cables and composed as a robot system. The controller is driven by a servo motor and others built in the robot body and controlled desirably.

Referring to FIGS. 1 to 3, explanations will be made into a structure of the robot controller of the present invention.

The robot controller of the present invention includes: a first housing 1 for accommodating the first internal devices 6; a second housing 2 for accommodating the second internal devices 7; an accommodating portion 11 provided below the first housing 1; and a front door 3 arranged on the front face of the first housing 1.

The front door 3 is opened and closed with respect to the first housing 1 and the first internal devices 6. The front door 3 is supported by the first hinge 4 so that it may be freely opened and closed at either the right or the left of the first housing 1. When the front door 3 is opened by the first hinge 4, it is possible to take a front view of the first internal devices 6. The front door 3 is provided with an emergency switch 16 and others. Cables 13 connected to the emergency switch 16 and others are connected from the side (on the side of an opening and closing fulcrum), on which the first hinge 4 is provided, to the first internal devices 6 along the back face of the front door 3. The front door 3 is provided with a main electric power switch 17 and a screw 18. The front door 3 may be fixed to the first housing 1 by the screw 18. When the screw 18 is removed from the front door 3 and the front door 3 is rotated at a specific angle under the condition that the rotary type main electric power switch 17 is turned off, the front door 3 may be opened from the first housing 1 being rotated round the first hinge 4.

Reference numeral 5 is a second hinge. The second hinge 5 supports the first door 1 itself so that the first door 1 may be freely opened and closed to either the right or the left of the second housing 2 like a door. That is, the entire first housing 1 is composed so that it may be freely opened and closed with respect to the second housing 2 being rotated round the second hinge 5. The first housing 1 may be fixed to the second housing 2 by a screw not shown in the inner portion of the housing. This screw is similar to the screw 18 described above.

When the screw not shown, which fixes the first housing 1 to the second housing 2, is removed and the first housing 1 is opened with respect to the second housing 2 by the second hinge 5, it is possible for a worker to take a front view of the second internal devices 7. That is, the first housing 1 functions as a front door, which is like the front door 3 with respect to the first housing 1, with respect to the second housing 2 and the second internal devices 7.

When the first housing 1 is opened, as shown in FIG. 3, the back plate 14 is arranged on the back face of the first housing 1. The first internal devices 6 described before are fixed onto this back plate 14. The cables 15 connected to the first internal devices 6 are connected to the second internal devices 7 from the side (the opening and closing fulcrum side), on which the second hinge 5 is arranged, through the opening 14a of the back plate 14.

Reference numeral 11 is an accommodating portion for accommodating the third internal devices 8 and the cable 9. The accommodating portion 11 is integrated with the second housing 2 into one body and protruded from a front face lower portion of the second housing 2 to a lower portion of the first housing 1. An inner space of the second housing 2 is connected to that of the accommodating portion 11. The accommodating portion 11 is composed in such a manner that an area of the accommodating portion 11 in the case of taking a plan view of the accommodating portion 11 from an upper face substantially coincides with an area of the lower face of the first housing 1. An upper surface of the accommodating portion 11 is open by the opening 12. The third internal devices 8 and the cables 9 are accommodated in the accommodating portion 11. Of course the accommodating portion 11 may be composed so that it may be separated from the second housing 2. Even in this case, an opening may be provided on a face where the accommodating portion 11 and the second housing 2 come into contact with each other so that the inner spaces may be connected with each other and the third internal devices 8 and the second internal devices 7 may be connected with each other by the cables 9.

In this connection, the first internal devices 6 include a CPU for controlling a robot. The second internal devices 7 include a drive control unit for driving a servo motor built in the robot body. The third internal devices 8 include a terminal table and an optional device. The first to third internal devices described above are connected to each other by cables.

According to the robot controller of the present invention composed as described above, first of all, when the front door 3 is opened being rotated round the first hinge 4 in FIG. 1, the first internal devices 6 appear as shown in FIG. 2. Due to the foregoing, a worker may have access to the first internal devices 6. Therefore, the worker may easily check and maintain the first internal devices 6.

Further, when the first housing 1 is opened being rotated round the second hinge 5, the second internal devices 7 appear as shown in FIG. 3. Due to the foregoing, a worker may have access to the second internal devices 7. Therefore, the worker may easily check and maintain the second internal devices 7. According to this structure, since the first housing 1, in which the first internal devices 6 are accommodated, is supported by the second hinge 5 being freely opened and closed, the entire first housing 1 is separated from the second housing. Therefore, unlike the conventional structure in which the partition plate arranged in the housing is opened and closed by the hinge provided in the housing, it is possible to check and maintain devices such as the second internal devices arranged in the inner portion of the front door without being obstructed by the housing. Further, there is no possibility that the inside becomes dark because of light-shielding made by the housing. Further, it is unnecessary to give consideration to a conventional problem in which the devices mounted on the partition plate interfere with the other device in the housing when the partition plate is opened. Accordingly, the internal devices may be freely laid out and the space may be effectively put into practical use. Since the front door 3 and the first housing 1 are opened and closed being rotated round the hinges, compared with the conventional sliding type, a distance of moving the cable is small. Therefore, the cable seldom falls off and damages.

Further, as shown in FIG. 3, when the first housing 1 is opened, the third internal devices 8 appear from the upper face opening 12 of the accommodating portion 11 located in a lower portion of the first housing 1. Due to the foregoing, a worker may have access to the third internal devices 8 and execute a maintenance work. In the case where the third internal devices 8 include a terminal table or an optional device, it is easy for the worker to execute a screwing work from the upper face. Therefore, the work may be easily accomplished. Even in the case where an optional device is added after the robot controller has been installed, it is possible to execute the work from the upper face. Therefore, the work may be easily accomplished. Further, cables of which the length is too long may be accommodated in the accommodating portion 11 being hung.

INDUSTRIAL APPLICABILITY

The present invention may be applied to not only the constitution of a robot controller but also the constitution of a controller of a machine tool or a common industrial machine.

The invention claimed is:
1. A robot controlling apparatus comprising:
a first hinge;
a first housing including a first inner space having a first front opening, the first housing including a rear side opposite to the first front opening;
a front door connected to the first housing via the first hinge to be rotatable around the first hinge to open and close the first front opening;
a first internal device provided in the first inner space;
a second hinge;
a second housing including a second inner space having a second front opening, the first housing connected to the second housing via the second hinge to be rotatable around the second hinge to open and close the second front opening, the second housing being provided at the rear side of the first housing in a state where the first housing closes the second front opening;
a second internal device provided in the second inner space;
an accommodating portion extending from a front portion of the second housing under the second front opening, the accommodating portion including a third inner space having an upper opening, the accommodating portion being provided under the first housing so that the first housing closes the upper opening in a state where the first housing closes the second front opening, the second inner space connecting to the third inner space; and
a third internal device provided in the third inner space.
2. The robot controlling apparatus according to claim 1, wherein the first internal device is exposed in a state where the front door opens the first front opening, and wherein the second and third internal devices are exposed in a state where the first housing opens the second front opening and the upper opening.
3. The robot controlling apparatus according to claim 1, wherein the accommodating portion is integrated with the second housing into one body.

4. A robot system comprising:
a robot; and
a robot controlling apparatus connected to the robot and comprising:
- a first hinge;
- a first housing including a first inner space having a first front opening, the first housing including a rear side opposite to the first front opening;
- a front door connected to the first housing via the first hinge to be rotatable around the first hinge to open and close the first front opening;
- a first internal device provided in the first inner space;
- a second hinge;
- a second housing including a second inner space having a second front opening, the first housing connected to the second housing via the second hinge to be rotatable around the second hinge to open and close the second front opening, the second housing being provided at the rear side of the first housing in a state where the first housing closes the second front opening;
- a second internal device provided in the second inner space;
- an accommodating portion extending from a front portion of the second housing under the second front opening, the accommodating portion including a third inner space having an upper opening, the accommodating portion being provided under the first housing so that the first housing closes the upper opening in a state where the first housing closes the second front opening, the second inner space connecting to the third inner space; and
- a third internal device provided in the third inner space.

5. The robot system according to claim 4, wherein the first internal device is exposed in a state where the front door opens the first front opening, and wherein the second and third internal devices are exposed in a state where the first housing opens the second front opening and the upper opening.

6. The robot system according to claim 4, wherein the accommodating portion is integrated with the second housing into one body.

* * * * *